(12) United States Patent
Hur et al.

(10) Patent No.: US 11,558,980 B2
(45) Date of Patent: Jan. 17, 2023

(54) SOLID STATE DRIVE DEVICE AND COMPUTER SERVER SYSTEM INCLUDING THE SAME

(71) Applicant: SAMSUNG ELECTRONICS CO., LTD., Suwon-si (KR)

(72) Inventors: Sung Chul Hur, Yongin-si (KR); Do Il Kong, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/665,518

(22) Filed: Feb. 5, 2022

(65) Prior Publication Data
US 2022/0174842 A1    Jun. 2, 2022

Related U.S. Application Data

(63) Continuation of application No. 16/740,593, filed on Jan. 13, 2020, now Pat. No. 11,272,640, which is a
(Continued)

(30) Foreign Application Priority Data

Nov. 5, 2018   (KR) .......................... 10-2018-0134682

(51) Int. Cl.
*H05K 7/20*    (2006.01)
*H05K 5/00*    (2006.01)
(Continued)

(52) U.S. Cl.
CPC ....... *H05K 7/20409* (2013.01); *H05K 1/0203* (2013.01); *H05K 1/181* (2013.01);
(Continued)

(58) Field of Classification Search
CPC ............... H05K 1/144; H05K 7/20172; H05K 7/20209; H05K 7/20409; H05K 2201/10159; H05K 7/20154; H05K 5/0213
(Continued)

(56) References Cited

U.S. PATENT DOCUMENTS 5,587,882 A    12/1996  Patel
5,774,335 A     6/1998  Pare
(Continued)

FOREIGN PATENT DOCUMENTS

CN    203164586 U    8/2013
CN    207399043 U    5/2018
(Continued)

OTHER PUBLICATIONS

Chinese Office Action dated Mar. 11, 2022, Cited in Related Chinese Application No. 201910858256.9.

*Primary Examiner* — Krystal Robinson
(74) *Attorney, Agent, or Firm* — Volentine, Whitt & Francos, PLLC

(57) ABSTRACT

A solid-state drive device includes a first module including a first region containing a volatile main memory device and a controller device and a second region containing a first nonvolatile memory device, a second module disposed on the first module and having a third region containing a second nonvolatile memory device, the second module being connected to the first module, and a heat dissipating member disposed on the second module as vertically juxtaposed with the first and second modules. The heat dissipating member has a protruding portion protruding toward the first module and in direct thermal contact with the first region, and a plate-shaped portion having a main surface in direct thermal contact with the third region.

20 Claims, 11 Drawing Sheets

Related U.S. Application Data continuation of application No. 16/362,732, filed on Mar. 25, 2019, now Pat. No. 10,582,644.

(51) Int. Cl.
*H05K 1/18* (2006.01)
*H05K 1/02* (2006.01)
*H01R 12/71* (2011.01)

(52) U.S. Cl.
CPC ....... *H05K 5/0021* (2013.01); *H05K 7/20727* (2013.01); *H01R 12/716* (2013.01); *H05K 2201/10159* (2013.01)

(58) Field of Classification Search
USPC .................................................... 361/679.32
See application file for complete search history.

(56) References Cited

U.S. PATENT DOCUMENTS

| | | | |
|---|---|---|---|
| 5,913,926 A * | 6/1999 | Anderson | G06F 1/187 361/600 |
| 6,088,227 A | 7/2000 | Bujtas | |
| 6,304,441 B1 | 10/2001 | Han | |
| 6,452,797 B1 | 9/2002 | Konstad | |
| 6,747,873 B1 | 6/2004 | Searls et al. | |
| 6,771,507 B1 | 8/2004 | Belady | |
| 6,807,061 B1 | 10/2004 | Harris | |
| 7,180,751 B1 | 2/2007 | Geschke | |
| 7,289,328 B2 | 10/2007 | Belady et al. | |
| 7,595,992 B2 | 9/2009 | Koga | |
| 7,957,134 B2 | 6/2011 | Farnsworth | |
| 8,120,912 B2 | 2/2012 | Aybay | |
| 9,405,336 B1 | 8/2016 | Li | |
| 9,485,851 B2 | 11/2016 | Ellis et al. | |
| 9,648,730 B2 | 5/2017 | Harvilchuck | |
| 9,772,664 B1 | 9/2017 | Chou | |
| 9,788,463 B2 | 10/2017 | Ozawa et al. | |
| 9,854,695 B1 | 12/2017 | Prabhakar | |
| 10,582,644 B1 | 3/2020 | Hur et al. | |
| 10,624,240 B2 | 4/2020 | Leigh | |
| 2001/0030037 A1 | 10/2001 | Hellbruck et al. | |
| 2002/0006027 A1 | 1/2002 | Rodriguez et al. | |
| 2002/0008963 A1 | 1/2002 | Dibene | |
| 2002/0114129 A1 | 8/2002 | Dibene | |
| 2003/0002268 A1 | 1/2003 | Dibene | |
| 2005/0047079 A1 | 3/2005 | Gasbarro | |
| 2005/0207115 A1 | 9/2005 | Barsun | |
| 2005/0276021 A1 | 12/2005 | Gates | |
| 2006/0109629 A1 | 5/2006 | Harris | |
| 2006/0132699 A1 | 6/2006 | Cho | |
| 2006/0133041 A1 | 6/2006 | Belady | |
| 2006/0244126 A1 | 11/2006 | Shibamoto | |
| 2007/0181699 A1 | 8/2007 | Yi | |
| 2008/0123300 A1 | 5/2008 | Tian | |
| 2008/0151487 A1 | 6/2008 | Ni | |
| 2010/0008038 A1 | 1/2010 | Coglitore | |
| 2010/0123372 A1 | 5/2010 | Huang et al. | |
| 2010/0128432 A1 | 5/2010 | Miller | |
| 2011/0032679 A1 | 2/2011 | Baek | |
| 2011/0298011 A1 | 12/2011 | Lee | |
| 2012/0162919 A1 | 6/2012 | Lin | |
| 2013/0037930 A1 | 2/2013 | Roh | |
| 2013/0194745 A1 | 8/2013 | Meijer | |
| 2014/0036435 A1 | 2/2014 | Kim | |
| 2014/0240925 A1 | 8/2014 | Okuaki | |
| 2014/0290926 A1 | 10/2014 | Kim et al. | |
| 2014/0293543 A1 | 10/2014 | Kim | |
| 2014/0327129 A1 | 11/2014 | Cho | |
| 2014/0332182 A1 | 11/2014 | Taras | |
| 2015/0046646 A1 | 2/2015 | Elzind | |
| 2015/0061571 A1 | 3/2015 | Lin | |
| 2015/0181746 A1 | 6/2015 | Mullen | |
| 2015/0378640 A1 | 12/2015 | Huang | |
| 2016/0081196 A1 | 3/2016 | Babin, Sr. | |
| 2016/0259597 A1 | 9/2016 | Worley et al. | |
| 2017/0038802 A1 | 2/2017 | Kwon et al. | |
| 2017/0186731 A1 | 6/2017 | Koike | |
| 2017/0262029 A1 | 9/2017 | Nelson | |
| 2017/0303431 A1 | 10/2017 | Kim | |
| 2018/0007776 A1 | 1/2018 | Gareau | |
| 2018/0203490 A1 | 7/2018 | Kim | |
| 2019/0006731 A1 | 1/2019 | Chiu | |
| 2019/0206764 A1 | 7/2019 | Kulkarni | |
| 2019/0246508 A1 | 8/2019 | Oh | |

FOREIGN PATENT DOCUMENTS

| | | | |
|---|---|---|---|
| JP | 2005-085908 A | 3/2005 | |
| JP | 5953734 B2 | 6/2016 | |

* cited by examiner

SOLID STATE DRIVE DEVICE AND COMPUTER SERVER SYSTEM INCLUDING THE SAME

PRIORITY STATEMENT

This is a Continuation of U.S. application Ser. No. 16/740,593, filed Jan. 13, 2020, which is a Continuation of U.S. application Ser. No. 16/362,732, filed Mar. 25, 2019, now U.S. Pat. No. 10,582,644, issued Mar. 3, 2020, which claims benefit of priority to Korean Patent Application No. 10-2018-0134682 filed on Nov. 5, 2018 in the Korean Intellectual Property Office, the disclosure of which is hereby incorporated by reference in its entirety.

BACKGROUND

1. Field

The present inventive concept relates to a solid-state drive device and a computer server system including the same.

2. Description of Related Art

As a next generation storage device to replace a hard disk drive of the related art, a solid-state drive device has attracted attention. Solid-state drive devices are nonvolatile memory-based storage devices with low power consumption and high storage density. In addition, solid-state drive devices can input and output a large amount of data at high speeds. Therefore, demand for solid state drive devices is expected to increase.

Furthermore, the data storage capacity of solid-state drive devices must be large to support a high-performance computer server system. To this end, i.e., to increase the capacity of solid-state drive devices, the number of modules of solid-state drive devices is increasing. Thus, the amount of heat generated by solid-state drive devices is increasing. However, due to a limited form factor, there is a limitation in improving heat dissipation efficiency.

SUMMARY

According to an aspect of the present inventive concept, a solid-state drive device includes a first module including a volatile main memory device, a controller and a first nonvolatile memory device, a second module disposed on and connected to the first module, and a heat dissipating member disposed on the second module such that the second module is interposed between the heat dissipating member and the first module. The first module has a first region containing the volatile main memory device and the controller and a second region containing the first nonvolatile memory device. The second module overlaps the second region of the first module as viewed in a plan view of the solid-state drive device, the second module includes a second nonvolatile memory device and the second module has a third region containing the second nonvolatile memory device. The heat dissipating member has a plate-shaped portion and a protruding portion. The protruding portion protrudes toward the first module relative to the plate-shaped portion and is in direct thermal contact with the first region of the first module, and the plate-shaped portion is vertically juxtaposed with respective portions of the first and second modules and is in direct thermal contact with the third region of the second module.

According to another aspect of the present inventive concept, a solid-state drive device includes a heat dissipating member having a lower surface and a protrusion protruding from a main part of the lower surface, whereby a distal end of the protrusion and the main part of the lower surface are disposed at a different levels in the solid-state drive device, a first module having a plurality of first semiconductor chips with at least a portion of the plurality of first semiconductor chips being in direct thermal contact with the distal end of the protrusion of the heat dissipating member, and a second module spaced apart from and interposed between the heat dissipating member and the first module. The second module has a plurality of second semiconductor chips, and at least a portion of the plurality of second semiconductor chips is in direct thermal contact with the main part of the lower surface of the heat dissipating member.

According to still another aspect of the present inventive concept, a solid-state drive device includes a first module, a second module stacked vertically on and physically joined and electrically connected to the first module, and a heat sink disposed on the second module and physically connected to the first and second modules with the second module interposed between the heat sink and the first module. The first module has a first region and a second region located laterally of the first region in the first module, and the first module comprises a first circuit board of the solid-state drive device, at least one semiconductor device mounted to the first circuit board in the first region, and at least one semiconductor device mounted to the first circuit board in the second region. The second module overlaps the second region as viewed in a plan view of the solid-state drive device, and the second module comprises a second circuit board of the solid-state drive device and at least one semiconductor device mounted to the second circuit board in a third region. The heat sink has a plate-shaped portion and a protruding portion. The protruding portion protrudes toward the first module relative to the plate-shaped portion, overlaps the at least one semiconductor device mounted to the first circuit board in the first region as viewed in a plan view of the solid-state drive device, and has a distal end at which the heat sink is in direct thermal contact with the first region of the first module. The plate-shaped portion is vertically juxtaposed with respective portions of the first and second modules, overlaps the at least one semiconductor device mounted to the second circuit board in the third region, and has a main surface at which the heat sink is in direct thermal contact with the third region, and the distal end of the protrusion and the main surface of the plate-shaped portion of the heat sink are disposed at different levels in the solid-state drive device.

According to still another aspect of the present inventive concept, a computer server system includes an enclosure having opposite ends and provided with an add-in card (AIC) form factor bay at one of the opposite ends, a cooling fan disposed at the other of the opposite ends of the enclosure and oriented to blow air in a first direction from said other of the opposite ends of the closure to said one of the opposite ends of the enclosure, an AIC form factor card adapter disposed in the AIC form factor bay, and a solid-state drive device mounted on the AIC form factor card adapter. The solid-state drive device includes a first module, a second module and a heat dissipating member juxtaposed with and physically connected to each other. The first module includes a volatile main memory device, a controller and a first nonvolatile memory device, and the first module having a first region containing the volatile main memory device and the controller and a second region containing the first nonvolatile memory device. The second module is interposed between the heat dissipating member and the first module, the second module overlapping the second region of the first module when viewed in a direction in which the first module, the second module and the heat dissipating member are juxtaposed, and the second module including a second nonvolatile memory device and having a third region containing the second nonvolatile memory device. The heat dissipating member has a plate-shaped portion and a protruding portion, the protruding portion protruding toward the first module relative to the plate-shaped portion and in direct thermal contact with the first region of the first module, and the plate-shaped portion juxtaposed with respective portions of the first and second modules and in direct thermal contact with the third region of the second module.

BRIEF DESCRIPTION OF DRAWINGS

The above and other aspects, features, and advantages of the inventive concept will be more clearly understood from the following detailed description, taken in conjunction with the accompanying drawings, in which:

FIGS. 7A to 8C illustrate another example of a solid state drive device according to the present inventive concept, wherein:

FIG. 7A is a plan view of a heat dissipating member the solid-state drive device, FIG. 8C is a cross-sectional view of the solid-state drive device taken in the same direction as line III-III' of FIG. 1;

FIGS. 9A to 10C illustrate another example of a solid state drive device according to the present inventive concept, wherein:

FIG. 9A is a plan view of a heat dissipating member the solid-state drive device, FIG. 10C is a cross-sectional view of the solid-state drive device taken in the same direction as line III-III' of FIG. 1.

DETAILED DESCRIPTION

Hereinafter, examples of the present inventive concept will be described in detail with reference to the accompanying drawings. Note, in the description that follows ordinal numbers are used solely to differentiate like elements or features from one another and is thus not limiting, e.g., should not be considered as implying that a component has a number of elements or features corresponding to the ordinal number.

A first example of a solid-state drive device according to the present inventive concept is shown in FIGS. 1 to 3C.

Figure 1:
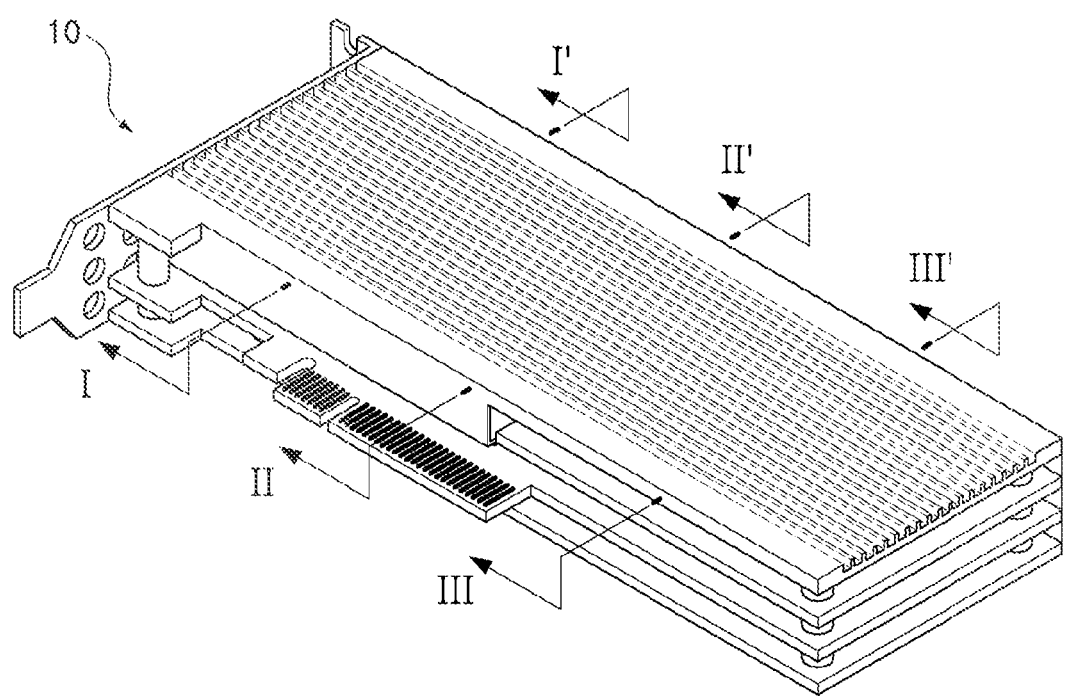
FIG. 1 is a perspective view of an example of a solid-state drive device according to the present inventive concept.
Figure 2:
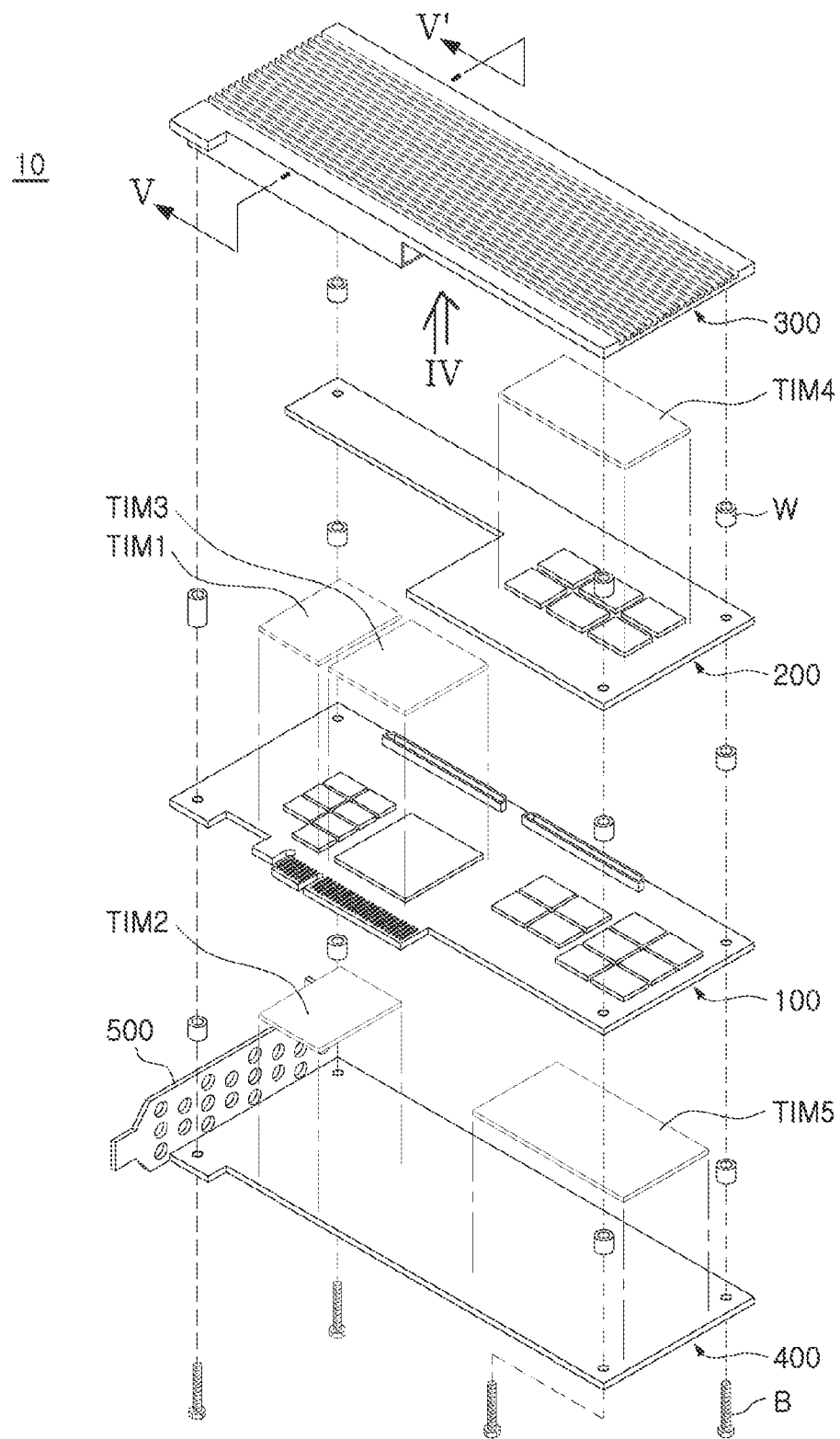
FIG. 2 is an exploded perspective view of the solid-state drive device of FIG. 1.

Referring to FIGS. 1 and 2, the solid-state drive device 10 may include a first module 100, a second module 200 disposed on the first module 100, and a heat sink 300 (referred to hereinafter as a heat dissipating member), vertically juxtaposed with the first module 100 and the second module 200. According to an example, a cover 400 is disposed on one surface of the first module 100.

The first module 100 and the second module 200 may be fixed to the heat dissipating member 300 through a coupling member B such as a bolt, and washers W may be disposed between the first module 100, the second module 200 and the heat dissipating member 300, to space such members apart from one another.

According to an example, a thermal interface material (TIM1-5), to be described later, is disposed on portions of contact between the first module 100, the second module 200, the heat dissipating member 300 and the cover 400.

The solid-state drive device 10 may be configured to satisfy a form factor standard such as a 2.5-inch hard disk (HDD), a 1.8-inch HDD, a 3.5-inch HDD, an M.2 as a next generation form factor (NGFF), mini serial advanced technology attachment (mSATA), or an add-in card (AIC). An example in which the AIC form factor is satisfied will be described.

Figure 3A:
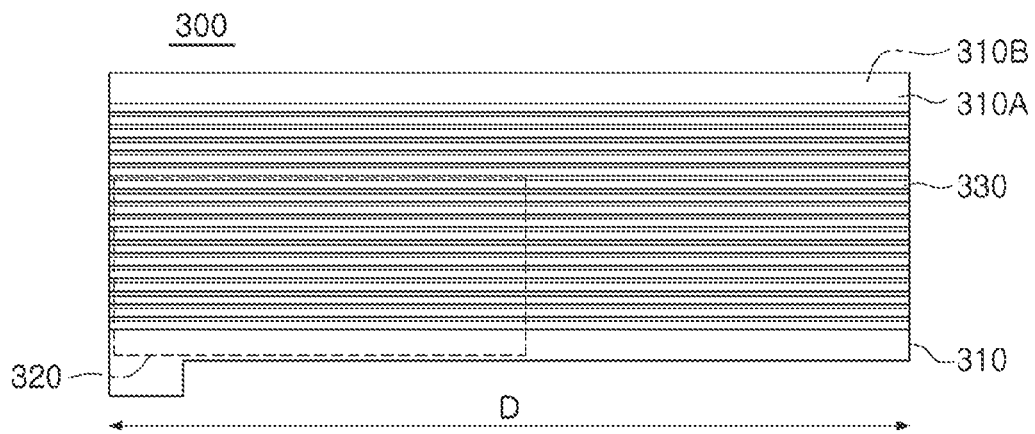
FIG. 3A is a plan view of a heat dissipating member of the solid-state drive device of FIG. 1.
Figure 3B:
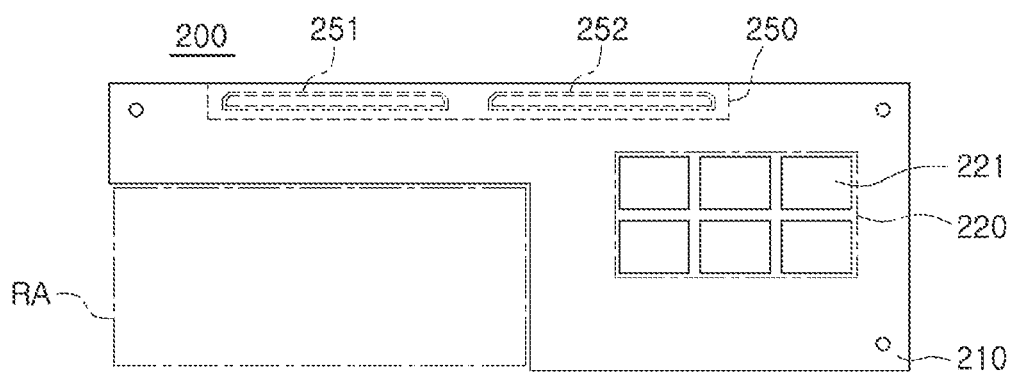
FIG. 3B is a plan view of a second module of the solid-state drive device of FIG. 1.
Figure 3C:
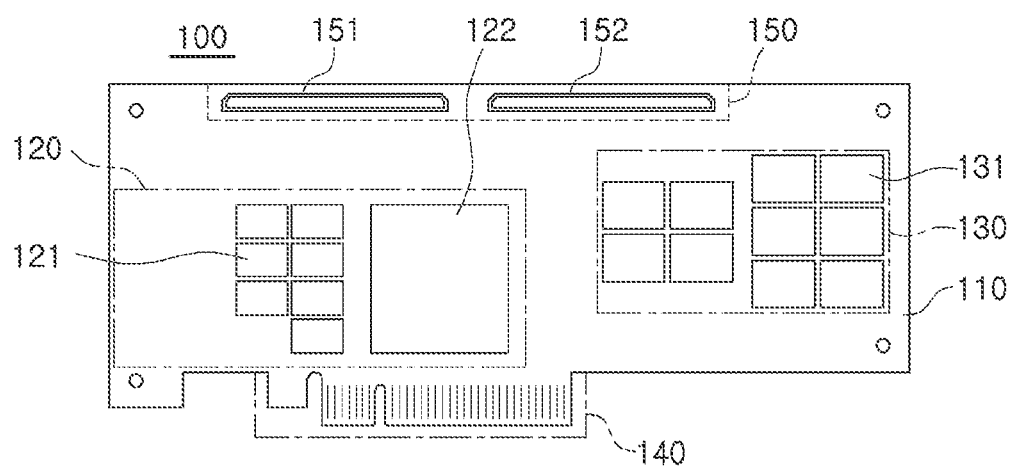
FIG. 3C is a plan view of a first module of the solid-state drive device of FIG. 1.

Referring to FIG. 3C, the first module 100 may include a first circuit board 110, a plurality of semiconductor chips mounted on the first circuit board 110, and a connector 150.

The first circuit board 110 may be a single layer or multilayer circuit board. For example, the first circuit board 110 is a printed circuit board (PCB). The printed circuit board may include circuit traces formed on the surface or inside thereof, and vias for a connection therebetween. The circuit traces may be a printed circuit pattern for an interconnection of the plurality of semiconductor chips to each other. The first circuit board 110 may be elongated in one direction. The first circuit board 110 may be provided with a terminal 140, disposed on one side thereof and provided for connection to an external device, and the connector 150 may be provided on the other side of the first circuit board 110. The connector 150 may include connection terminals for a connection to the second module 200. The plurality of semiconductor chips may include a main memory device 121, a controller device 122, and a nonvolatile memory device 131.

The first module 100 may have a first region 120 and a second region 130. The first region 120 may be in direct thermal contact with the heat dissipating member 300, to dissipate heat by heat conduction, and the main memory device 121 and the controller device 122 may be contained in, i.e., may comprise, the first region 120. The first circuit board 110 may have a region that does not overlap a second circuit board 210, as viewed in plan.

The second region 130 may be spaced from, i.e., may be disposed out of contact with the heat dissipating member 300, such that heat from the second region 130 is dissipated by radiation or convection. The nonvolatile memory device 131 may be mounted to the first circuit board 110 in the second region 130. On the other hand, as will be described later, according to an example, a portion of the second region 130 is in direct thermal contact with the heat dissipating member 300 so that heat dissipates from that portion of the second region by conduction.

Although the first region 120 may be in thermal contact with the heat dissipating member 300 by contacting the heat dissipating member, the first region 120 may also be in thermal contact with the heat dissipating member 300 through a thermal interface material to improve heat conduction efficiency. In other words, direct thermal contact of two elements/regions according to this detailed description may only occur if the elements/regions are in contact with each other or if thermal interface material (TIM) is interposed between the elements/regions as disposed in contact with each of the elements/regions. As is understood in the art, thermal interface material per se is a material promoting heat transfer. Examples of thermal interface material that may be used in a solid state drive according to the present inventive concept include grease, thermally conductive adhesive, mineral oil, gap filler putty, a gel or pad formed of a phase change material, or a particle filled epoxy. Examples of commercially available greases include ShinEtsu G750, ShinEtsu G751, ShinEtsu G765, and Berquist TIC-7500. Examples of the phase change material include Thermax HF60110-BT, Chromerics T725, Chromerics T443, Chromerics T454, Thermagon T-pcm 905c, Berquist 200 U, Berquist HiFlow 225-U, or Berquist HiFlow 225-UT may be used. As the thermally conductive adhesive, Chromerics therm-A-form T642 or the like may be used. However, the materials of the thermal interface material are not limited to these examples.

In an example, the main memory device 121 and the heat dissipating member 300 are in direct thermal contact with each other through the thermal interface material TIM1, and the controller device 122 and the heat dissipating member 300 are in direct thermal contact with each other through the thermal interface material TIM3.

The main memory device 121 may be disposed adjacent to the controller device 122 on the first region 120 of the first circuit board 110. The main memory device 121 may be, for example, a volatile memory semiconductor device such as a dynamic random access memory (DRAM). The main memory device 121 may be used as a buffer temporarily storing data received from the controller device 122 or temporarily storing data read from the nonvolatile memory device 131. In addition, the main memory device 121 may be used to drive software (S/W) used for efficient management of the nonvolatile memory device 131.

In an example, seven main memory devices 121 are disposed on an upper surface of the first circuit board 110, and seven (the same number of) main memory devices 121 are disposed on a lower surface of the first circuit board 110.

The controller device 122 may provide an interface and a protocol between the nonvolatile memory device 131 and a host, for example, a computer server employing a solid-state drive device. The controller device 122 may provide an interface between the nonvolatile memory device 131 and the host, by a peripheral component interconnect express (PCIe), a remote direct memory access (RDMA) via Ethernet, a Serial Advanced Technology Attachment (SATA), Fibre Channel, Serial Attached SCSI (SAS), or Nonvolatile Memory Express (NVMe), or by a standard protocol such as Ethernet or Universal Serial Bus (USB). The controller device 122 may also perform wear leveling, garbage collection, bad block management and error correcting code (ECC) for the nonvolatile memory device 131.

The first module 100 may be detachably attached to the second module 200 through the connector 150. The connector 150 may be inserted into a socket 250 provided in the second module 200. In this example, multiple ones of the connectors 150 and sockets 250 are provided, e.g., a first connector 151 and a second connector 152, and a first socket 251 and a second socket 252 corresponding thereto. Thus, the first module 100 and the second module 200 may be electrically connected to each other.

At least one nonvolatile memory device 131 may be provided on the second region 130 of the first circuit board 110, i.e., one or a plurality of nonvolatile memory devices 131 may be provided. In addition, according to an example, the first circuit board 110 has a plurality of second regions 130. For example, an upper surface of the first circuit board 110 includes a plurality of the second regions 130 with one or more nonvolatile memory devices 131 provided on each region. According to another example, nonvolatile memory devices 131 may be respectively disposed (individually or in groups) on an upper surface and a lower surface of the first circuit board 110.

In an example, ten nonvolatile memory devices 131 are disposed on the upper surface of the first circuit board 110, and ten (the same number of) nonvolatile memory devices 131 are disposed on a lower surface of the first circuit board 110.

The nonvolatile memory device 131 may be a storage medium of the solid-state drive device 10. The nonvolatile memory device 131 may be, for example, a NAND flash memory, a resistive random access memory (RRAM), a magnetoresistive RAM (MRAM), a phase-change RAM (PRAM), or a ferroelectric RAM (FRAM). The nonvolatile memory device 131 may be connected to the controller device 122 via at least one channel. The nonvolatile memory device 131 may include a single nonvolatile memory chip or a plurality of stacked nonvolatile memory chips.

As mentioned above, the thermal interface material (TIM) may be disposed on the nonvolatile memory device 131. For example, when the nonvolatile memory device 131 is disposed on the lower surface of the first circuit board 110 and the cover 400 is coupled to the lower surface, the nonvolatile memory device 131 may be in direct thermal contact with the cover 400 through thermal interface material TIM5.

Furthermore, passive devices or active devices such as a chip resistor, a chip capacitor, an inductor, a switch, a temperature sensor, a DC-DC converter, a voltage regulator, a quartz crystal for generating a clock signal, or the like may be mounted on the first circuit board 110.

The terminal 140 may be provided on a side edge of the first circuit board 110. The terminal 140 may connect the solid-state drive device 10 to the host to transmit and receive signals and/or receive power. The terminal 140 may have plurality of wiring lines. The terminal 140 may be based on a protocol such as, for example, Peripheral Component Interconnect Express (PCIe), remote direct memory access (RDMA) over Ethernet, Serial Advanced Technology Attachment (SATA), Fibre Channel, Serial Attached SCSI (SAS), or NonVolatile Memory Express (NVMe), or may provide a standard interface such as Ethernet or Universal Serial Bus (USB).

According to an example, the cover 400 covers one surface of the first module 100. The cover 400 may cover the first module 100 to protect the first module 100 from an external impact. In addition, the cover 400 is formed of a material having relatively high thermal conductivity, such that the heat transferred from the first module 100 by radiation or convection may be effectively discharged from a surface of the cover 400 into the air. In addition, the cover 400 may be in direct thermal contact with the first module 100 through the thermal interface material TIM2 and/or TIM5.

One side of the cover 400 may be provided with a guide 500 for fixing the solid-state drive device 10 to an enclosure of a computer server system to be described later, and the guide 500 may be coupled to the enclosure by a coupling member such as a bolt.

Referring to FIG. 3B, the second module 200 may include the second circuit board 210, a plurality of semiconductor chips mounted on the second circuit board 210, and a socket 250. The second module 200 is a module added to the first module 100, as disposed thereon, to increase the capacity of the solid-state drive device 10. To this end, a nonvolatile memory device(s) 221 may be mounted to the circuit board 210, but the inventive concept is not limited to the second module 200 having a nonvolatile memory device(s) as a data storage medium. Furthermore, in the case in which the second module 200 includes a nonvolatile memory device another semiconductor chip(s) may also be mounted to the circuit board 210.

In any case, the second module 200 is spaced apart from the first module 100 by a predetermined distance, and may overlie the first module 100, i.e., may be vertically juxtaposed with the first module 100. The second module 200 may be disposed between the heat dissipating member 300 and the first module 100. The second module 200 may be connected to the first module 100 through the socket 250. The second module 200 may have an area less than that of the first module 100.

The second circuit board 120 may be a single layer or multilayer circuit board in the same manner as the first circuit board 110 of the first module 100. For example, the second circuit board 210 may be a printed circuit board (PCB). A region RA of the solid-state device 10 in the same plane as the second circuit board 210 includes an opening through the second circuit board 210 over the first region 120 of the first module 100. A protruding portion 320 of the heat dissipating member 300 extends through the opening of region RA and is in direct thermal contact with the first region 120 of the first circuit board 110.

A third region 220 in which a nonvolatile memory device 221 is mounted to the second circuit board 210 does not overlap the first region 120 of the first circuit board 110, as viewed in plan. According to another example, a nonvolatile memory device 221 is mounted on a lower surface of the second circuit board 210.

Figure 4:
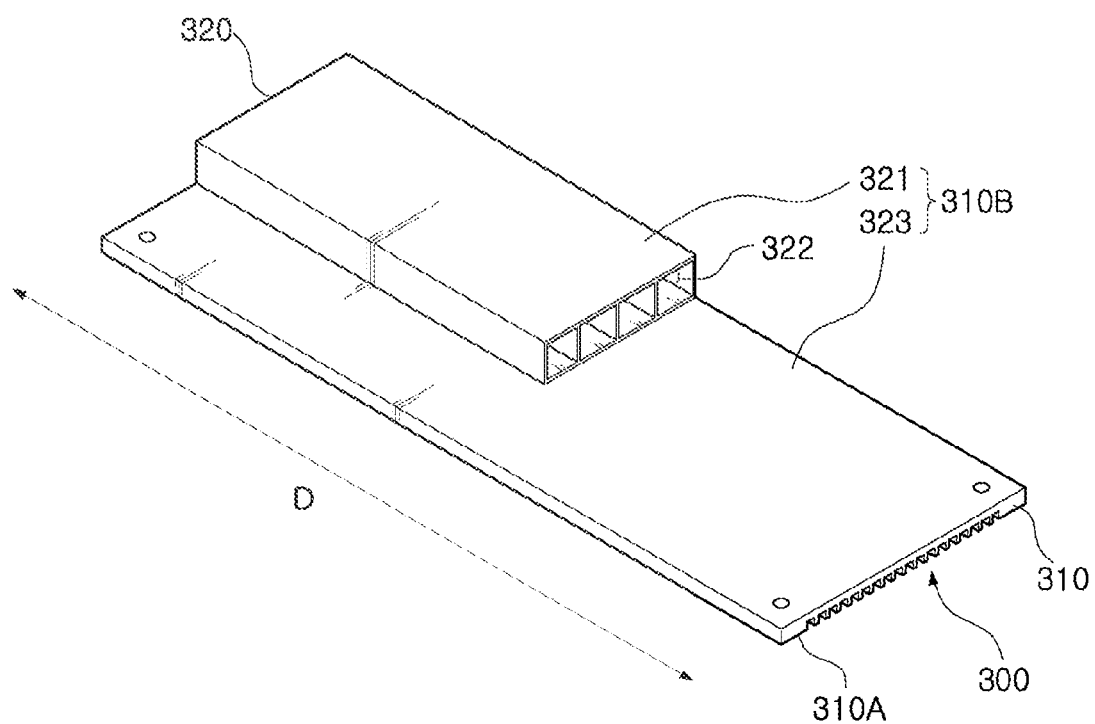
FIG. 4 is a view of the heat dissipating member of the solid-state drive device of FIG. 1, when viewed in direction IV FIG. 2.

Referring to FIGS. 3A and 4, the heat dissipating member 300 may overlie the first module 100 and the second module 200, and may cover the second module 200. The heat dissipating member 300 may store heat emitted from the first module 100 and the second module 200, and may transmit the heat to the air to lower temperatures of the first module 100 and the second module 200. The heat dissipating member 300 may be formed of a single material, or may be a combination of members formed of different materials in consideration of heat storage and transfer characteristics. The heat dissipating member 300 may be formed of a metal, a carbon-based material, a polymer material, or a combination thereof, but the material of the heat dissipating member 300 is not limited to these examples of materials. Preferably, though, the heat dissipating member 300 is formed of a metal having a relatively high thermal conductivity, such as copper, an aluminum alloy, a stainless steel alloy, or a magnesium alloy.

The heat dissipating member 300 may include a substrate 310 having an upper surface 310A and a lower surface 310B. Referring to FIG. 3A, the upper surface 310A of the heat dissipating member 300 may be provided with grooves 330 therein extending in a longitudinal direction D of the heat dissipating member 300, to improve heat dissipation efficiency. Referring to FIG. 4, the protruding portion 320 of the heat dissipating member 300 protrudes from a (main) part 323 of the lower surface 310B of the substrate 310. The main part 323 of the lower surface 310B, i.e., the part of the lower surface excluding the protruding portion 320, may be a flat surface. A distal part of the protruding portion 320 is disposed on a level different from that of the main part 323 of the lower surface 310B. The distal part may be constituted by a surface 321 (referred to hereinafter as the "protruding surface") and the protruding surface 321 may be a flat surface parallel to the main part 323 of the lower surface 310B. The distal part, e.g., the protruding surface 321, may be in direct thermal contact with the first module 100, and the main part 323 of the lower surface 310B may be in direct thermal contact with the second module 200. For example, the protruding surface 321 may be disposed in contact with the first region 120 of the first module 100, and the main surface 323 may be disposed in contact with the third region 220 of the second module 200. The lower surface 321 of the protruding portion 320 and the main part 323 of the lower surface 310B of the heat dissipating member 300 may be spaced vertically relative to each other and/or are disposed in direct thermal contact with regions of the first and second modules 100 and 200 in consideration of producing a desired rate of heat transfer from the first module 100 and the second module 200.

Figure 5A:
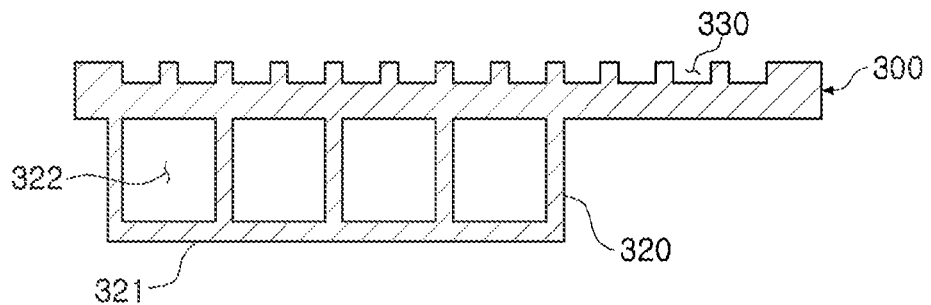
FIG. 5A is a cross-sectional view of the heat dissipating member taken along line V-V' in FIG. 2.
Figure 5B:
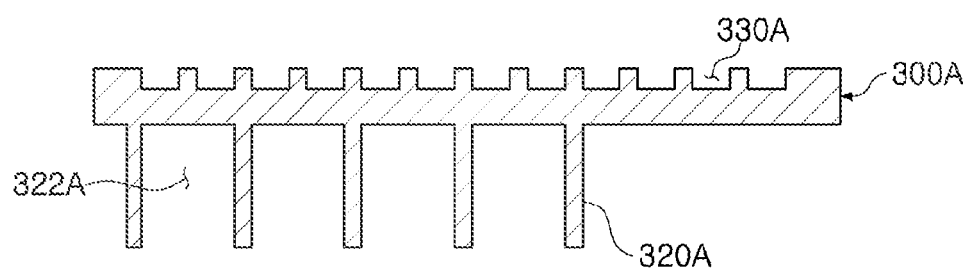
FIGS. 5B, 5C and 5D are cross-sectional views of other examples of the heat dissipating member of a solid-state drive device according to the inventive concept.
Figure 5C:
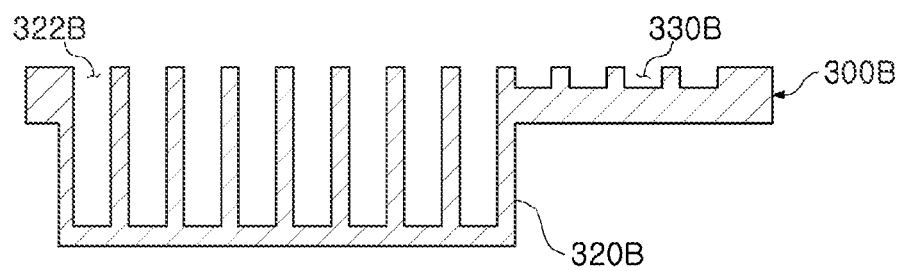

Referring to FIG. 4, one or more air holes 322 may be formed in both sides of the protruding portion 320 and may provide air passageways extending laterally through the protruding portion 320 in the longitudinal direction D of the heat dissipating member 300. The air holes 322, i.e., the air passageways, may be formed to have various cross-sectional shapes. For example, the air holes 322 may have circular, elliptical, or polygonal various cross sections. As illustrated in FIG. 5A, as an example the cross section of the air hole 322 is quadrangular. In an example as illustrated in FIG. 5B, the air holes 322a of protruding portion 320A are channels running through the protruding portion 320A and open at the bottom of the protruding portion. Hence, the cross section of an air hole 322A may also be quadrangular. Grooves 330, 330A may be formed in an upper surface of the heat dissipating member 300, 300A, including in the upper surfaced of the protruding portion 320, 320A, to improve heat dissipation efficiency In an example as illustrated in FIG. 5C, the air holes 322B of protruding portion 320B are also channels, but in this example each air hole 322B (channel) of protruding portion 320B is open at the top of the protruding portion 320B.

Figure 5D:
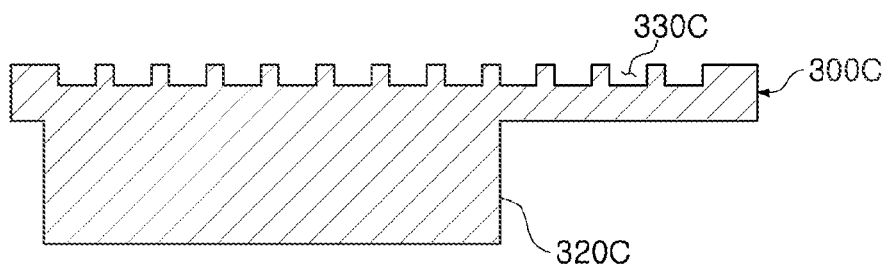

FIG. 5D illustrates an example of a heat dissipating member 300C having a solid protruding portion 320C. More specifically, the protruding portion 320C is solid at least below the level of the main part 323 of the bottom surface 310B of the heat dissipating member. However, grooves 330C may be formed in an upper surface of the heat dissipating member 300C, including in the upper surfaced of the protruding portion 320C, to improve heat dissipation efficiency.

In an example such as that of FIG. 5A described above, the surface area of the heat dissipating member 300 is in effect increased by the provision air hole(s) 322 to improve heat dissipation efficiency, and the heat dissipation efficiency of the heat dissipating member 300 is enhanced by the flow of air flowing through the air hole 322. The air hole 322 may be disposed to face a side of the second module 200 such that the flow of cool air passing through the air hole 322 from the outside may be naturally directed toward the second module 200. Thus, the heat dissipation efficiency of the nonvolatile memory device 221 mounted on the second module 200 may be improved. As will be described later in more detail, in the case in which the solid-state drive device 10 is mounted in a computer server system, when the longitudinal direction D of the heat dissipating member 300 is aligned with a blowing direction of a cooling fan, cooling efficiency may be further improved.

The releasing of heat of the first module 100 and the second module 200 will be described below with reference to FIGS. 6A to 6C.

Figure 6A:
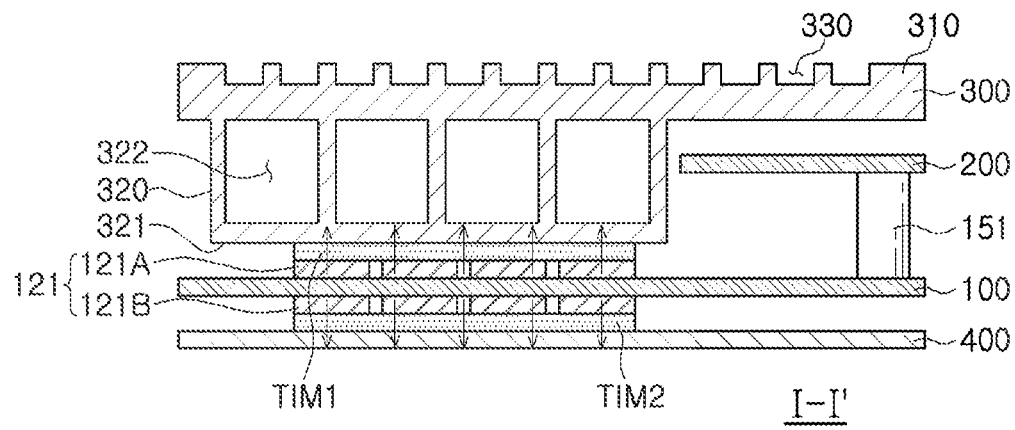
FIG. 6A is a cross-sectional view taken along line I-I' of FIG. 1.
Figure 6B:
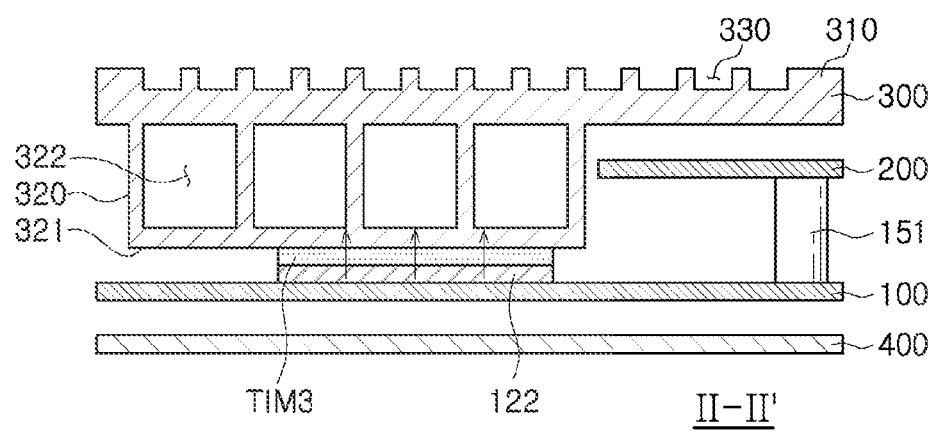
FIG. 6B is a cross-sectional view taken along line II-II' of FIG. 1.

Referring to FIG. 6A, by virtue of the thermal interface material TIM1 the heat dissipating member 300 is in direct thermal contact with a main memory device 121A disposed on an upper surface of the first module 100. Referring to FIG. 6B, by virtue of the thermal interface material TIM3 the heat dissipating member 300 is in direct thermal contact with the controller device 122 disposed on the upper surface of the first module 100. Thus, heat emitted from the main memory device 121A and the controller device 122, disposed on the upper surface of the module 100, may be quickly dissipated through the heat dissipating member 300.

Referring also to FIG. 6A, a main memory device 121B disposed on a lower surface of the first module 100 is in direct thermal contact with the cover 400 by virtue of the thermal interface material TIM2 to emit heat.

Figure 6C:
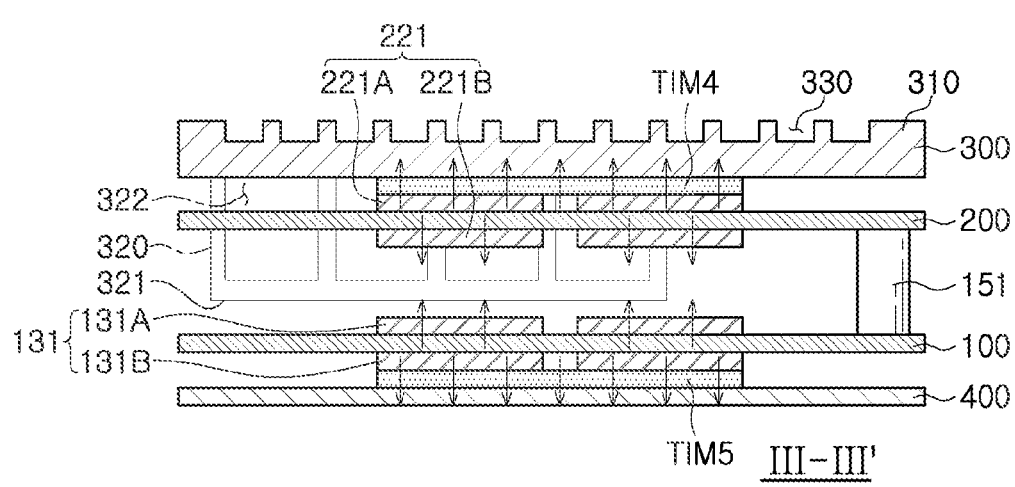
FIG. 6C is a cross-sectional view taken along line III-III' of FIG. 1.

Referring to FIG. 6C, by virtue of the thermal interface material TIM4 the heat dissipating member 300 is in direct thermal contact with a nonvolatile memory device 221A disposed on an upper surface of the second module 200. Thus, heat emitted from the nonvolatile memory device 221A of the second module 200 may be quickly dissipated. The nonvolatile memory device 221B disposed on the lower surface of the second module 200 and the nonvolatile memory module 131A disposed on the upper surface of the first module 100 are not in contact with the heat dissipating member 300, but in this example are disposed in front of the holes 322 to be cooled by air flowing through the air holes 322. The nonvolatile memory device 131B disposed on the lower surface of the first module 100 may be in direct thermal contact with the cover 400 through the thermal interface material TIM5 to emit heat.

Thus, in the case of this example of the solid-state drive device 10 according to the present inventive concept, the heat dissipating member 300, the first module 100 and the second module 200 are in direct thermal contact with one another. The nonvolatile memory device 221B disposed on the lower surface of the second module 200 and the nonvolatile memory device 131A disposed on the upper surface of the first module 100 may be cooled by air flowing through the air holes 322 in the protruding portion 320. Thus, heat dissipation efficiency of the solid-state drive device 10 is great.

Another example of a solid-state drive device according to the present inventive concept is shown in FIGS. 7A to 8C. Features and aspect of this example which are similar to those in the example described above, as will be clear from their depiction in the figures, may not be described again in detail or may only be described briefly for the sake of brevity.

Figure 7A:
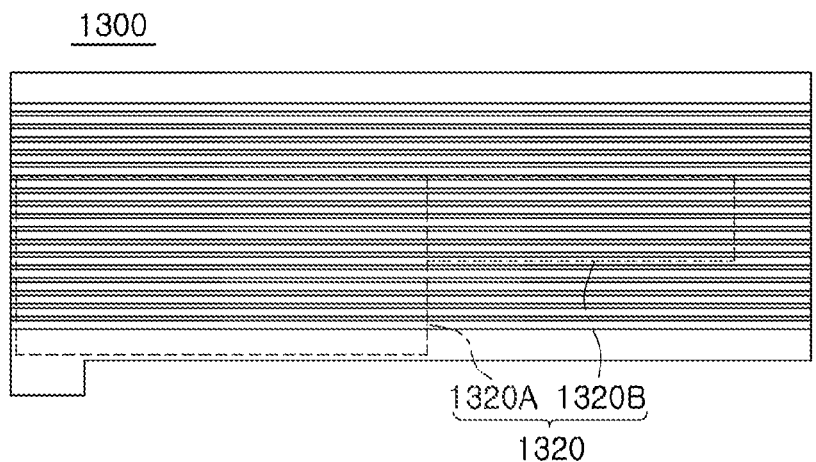
Figure 7B:
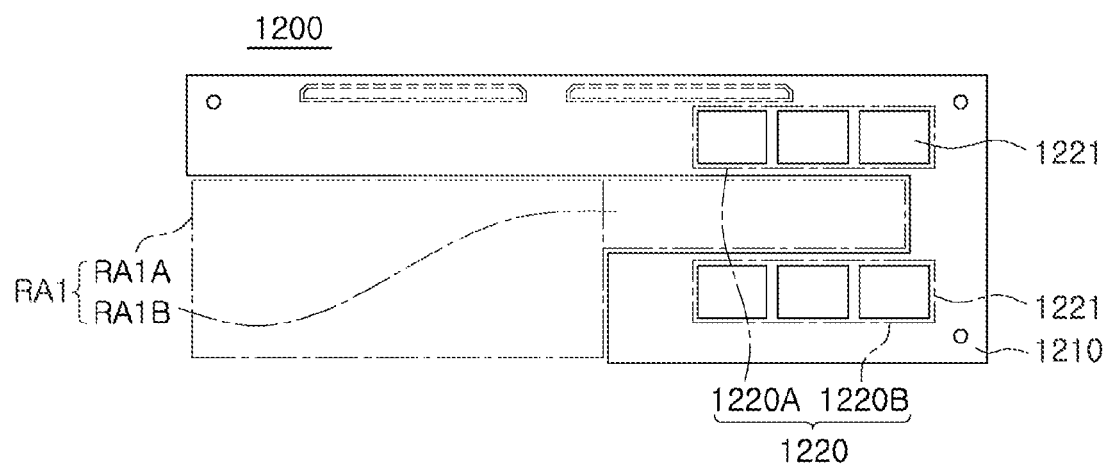
FIG. 7B is a plan view of a second module of the solid-state drive device.
Figure 7C:
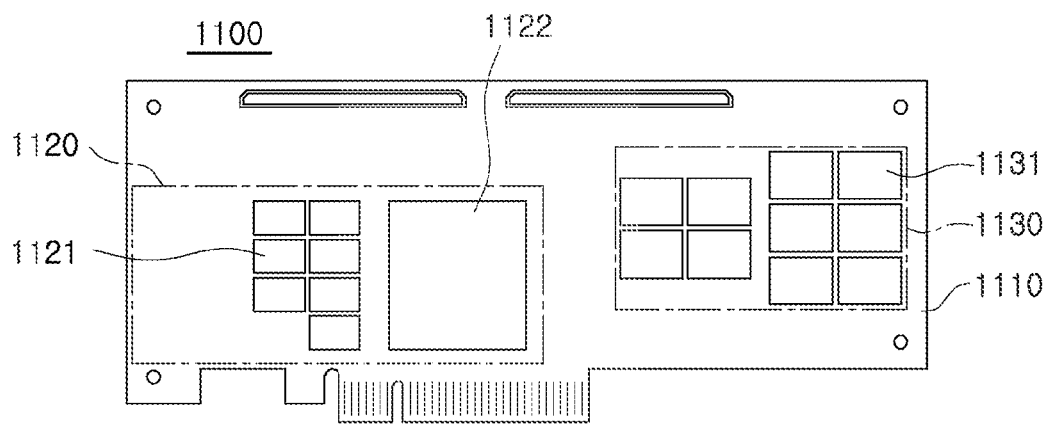
FIG. 7C is a plan view of a first module of the solid-state drive device.
Figure 8A:
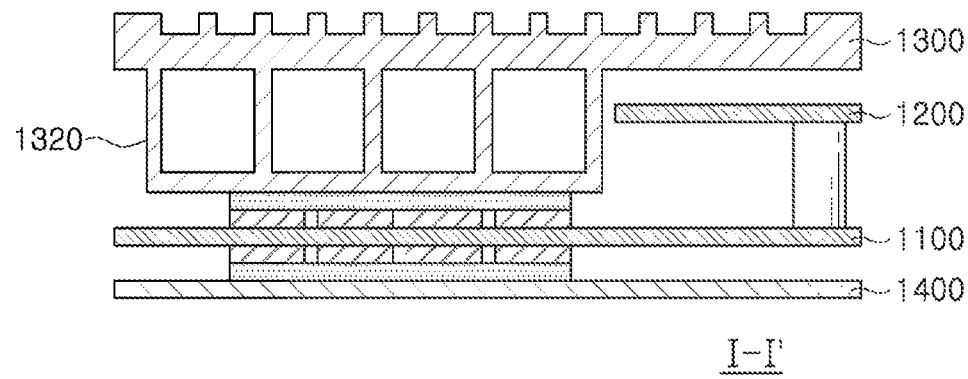
FIG. 8A is a cross-sectional view of the solid-state drive device taken in the same direction as line I-I' of FIG. 1.
Figure 8B:
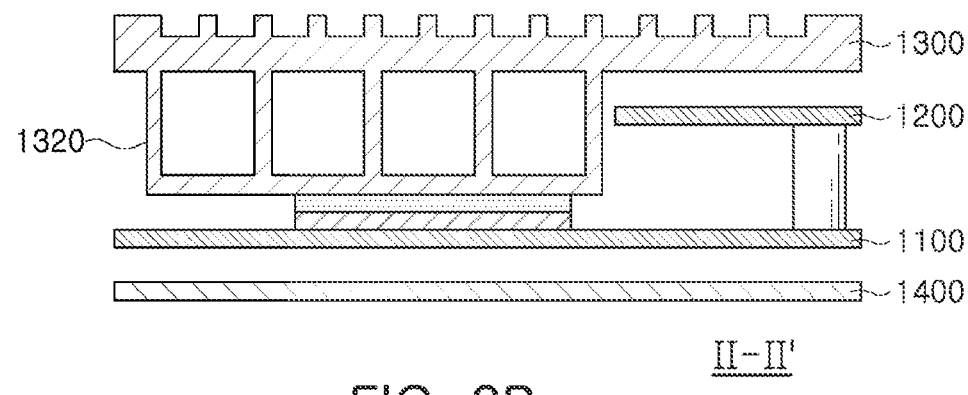
FIG. 8B is a cross-sectional view of the solid-state drive device taken in the same direction as line II-II' of FIG. 1.
Figure 8C:
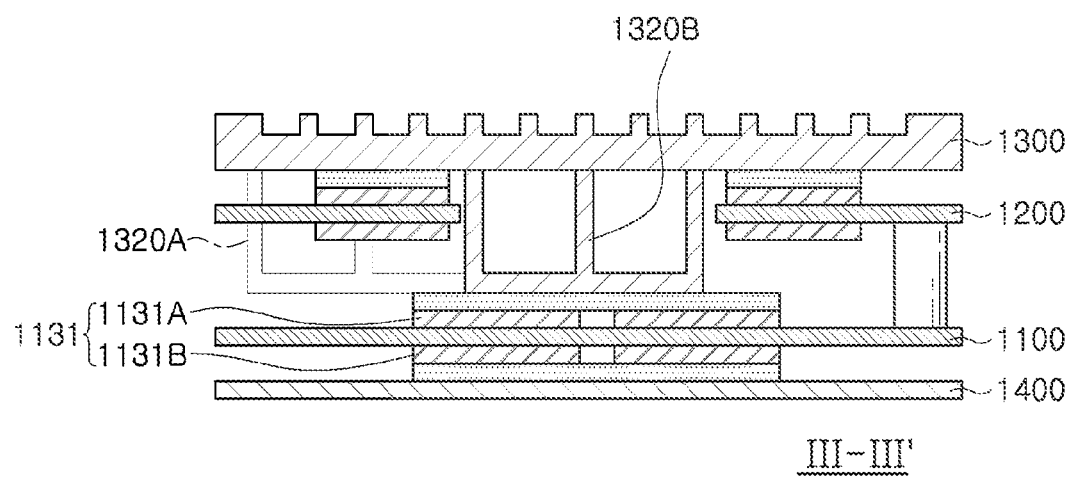

Referring to FIGS. 7A to 7C, a solid-state drive device includes a first module 1100, a second module 1200, and a heat dissipating member 1300. Referring to FIGS. 8A to 8C a cover 1400 may be disposed on one surface of the first module 1100. A main memory device 1121 may be disposed adjacent to a controller device 1122 on a first circuit board 1110 in a first region 1120 of the first module 1100.

The heat dissipating member 1300 has a protruding portion 1320. The protruding portion 1320 has a first protruding section 1320A vertically juxtaposed with the first region 1120 of the first module 1100, and a second protruding section 1320B vertically juxtaposed with a portion of a second region 1130 of the first module 1100.

The second module 1200 has an open region RA1 or "opening" in the plane of the second circuit board 1210, with one part RA1A of the opening overlying the second region 1130 and a second part RA1A of the opening overlying the first region 1120. A third region 1220 in which a nonvolatile memory device 1221 of the second module 1200 is mounted to second circuit board 1210 may be divided into two parts 1220A and 1220B.

FIGS. 8A and 8B illustrate that this example of a solid-state drive device has respective cross sections that are similar to those of the solid-state drive device in the foregoing example. On the other hand, referring to FIG. 8C, the second protruding section 1320B of the heat dissipating member 1300 is in direct thermal contact with a nonvolatile memory device 1131A mounted on an upper surface of the first module 1100. A nonvolatile memory device 1131B of a nonvolatile memory device 1131, mounted on a lower surface of the first circuit board 1110, may be in direct thermal contact with a cover 1400.

Another example of a solid-state drive device according to the inventive concept is shown in FIGS. 9A to 10C. Features and aspect of this example which are similar to those in the example described above, as will be clear from their depiction in the figures, may not be described again in detail or may only be described briefly for the sake of brevity.

Figure 9A:
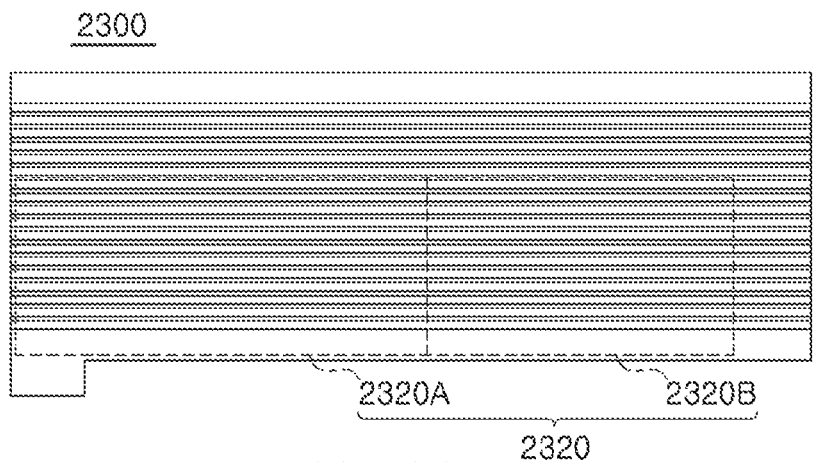
Figure 9B:
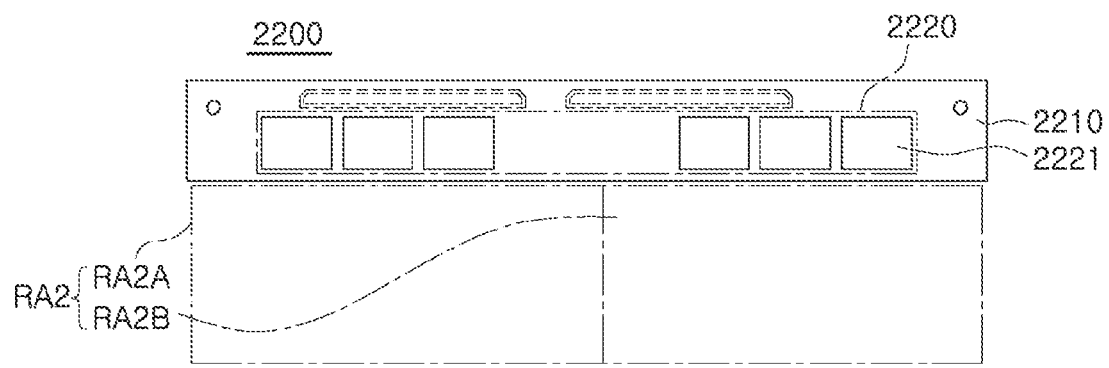
FIG. 9B is a plan view of a second module of the solid-state drive device.
Figure 9C:
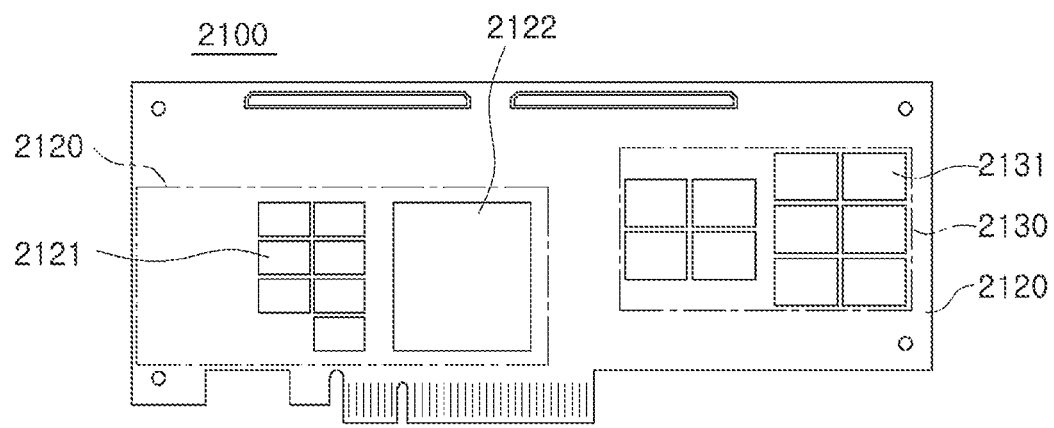
FIG. 9C is a plan view of a first module of the solid-state drive device.

Referring to FIGS. 9A to 9C, this example of a solid-state drive device includes a first module 2100, a second module 2200, and a heat dissipating member 2300. Referring to FIGS. 8A to 8C a cover 2400 may be disposed on one surface of the first module 2100. A main memory device 2121 may be disposed adjacent to a controller device 2122 in a first region 2120 of the first module 2100.

The heat dissipating member 2300 includes a protruding portion 2320 having a first protruding section 2320A vertically juxtaposed with a first region 2120 of the first module 2100 and a second protruding section 2320B vertically juxtaposed with a portion of a second region 2130 of the first module 2100.

Figure 10A:
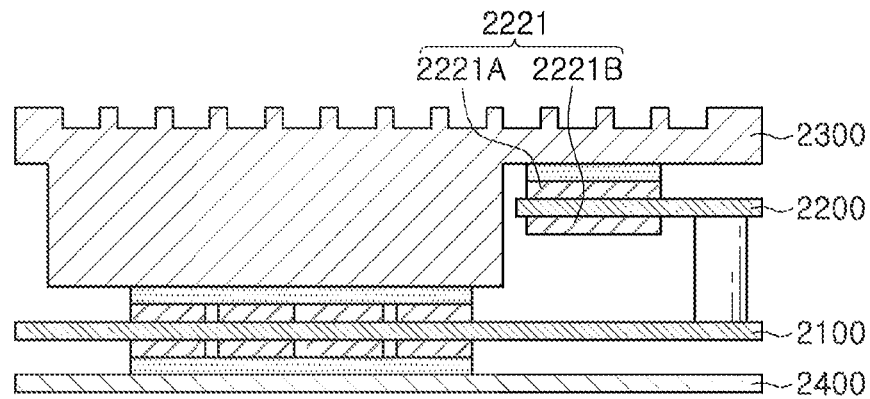
FIG. 10A is a cross-sectional view of the solid-state drive device taken in the same direction as line I-I' of FIG. 1.
Figure 10B:
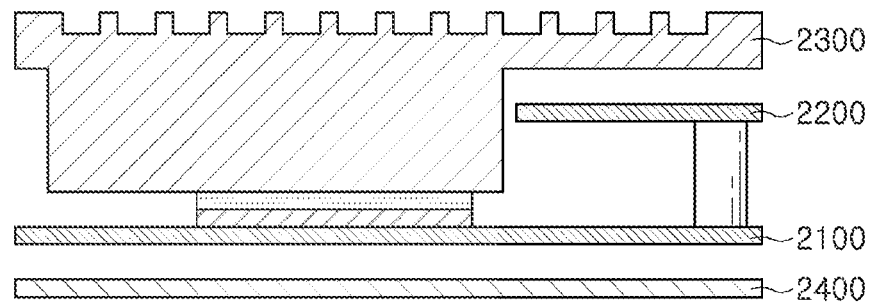
FIG. 10B is a cross-sectional view of the solid-state drive device taken in the same direction as line II-II' of FIG. 1.
Figure 10C:
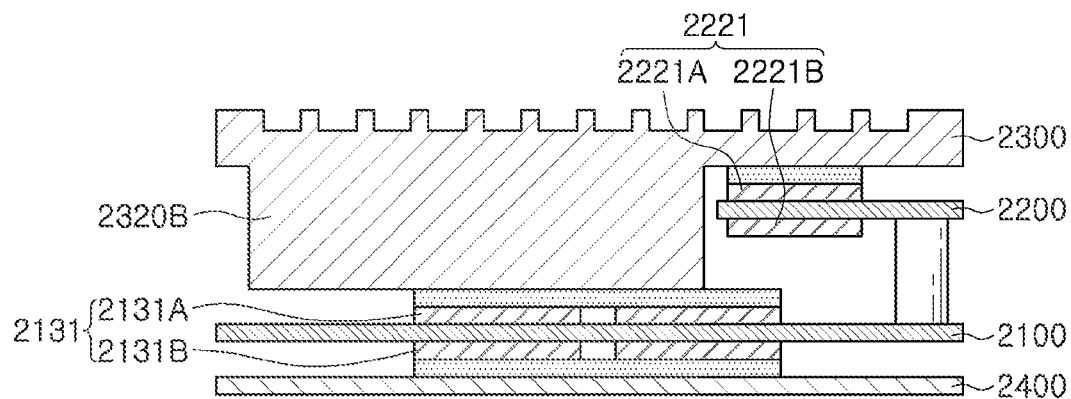

The second module 2200 may have an open region RA2 or "opening" in the plane of the second circuit board 2210, and the open region RA2 includes an opening RA2B juxtaposed with the second region 2130 as well as an opening RA2A juxtaposed with the first region 2120. The second circuit board 2210 may have a rectangular shape, i.e., may be elongated in one direction. A third region 2220 in which a nonvolatile memory device 2221 of the second module 2200 is mounted on the second circuit board 2210 may be elongated in a longitudinal direction of the second circuit board 2210. Thus, as illustrated in FIG. 10C, the nonvolatile memory device 2221 of the second module 2200 may be in direct thermal contact with heat dissipating member 2310. A nonvolatile memory device 2221B mounted on a lower surface of the second circuit board 2210 may be cooled by air, while a nonvolatile memory device mounted on an upper surface of the second circuit board 2210 may be in direct thermal contact with the heat dissipating member 2300 to be cooled thereby. A nonvolatile memory device 2131A mounted on an upper surface of the first circuit board 2120 may be in direct thermal contact with the second part 2320B of the protruding portion 2320 of the heat dissipating member 2300. A nonvolatile memory device 2131B mounted on the lower surface of the first circuit board 2120 may be in direct thermal contact with the cover 2400.

In this example a large area of direct thermal contact exists between the first module 2100 and the heat dissipating member 2320. Therefore, the solid-state drive device of this example has high heat dissipation efficiency.

Figure 11:
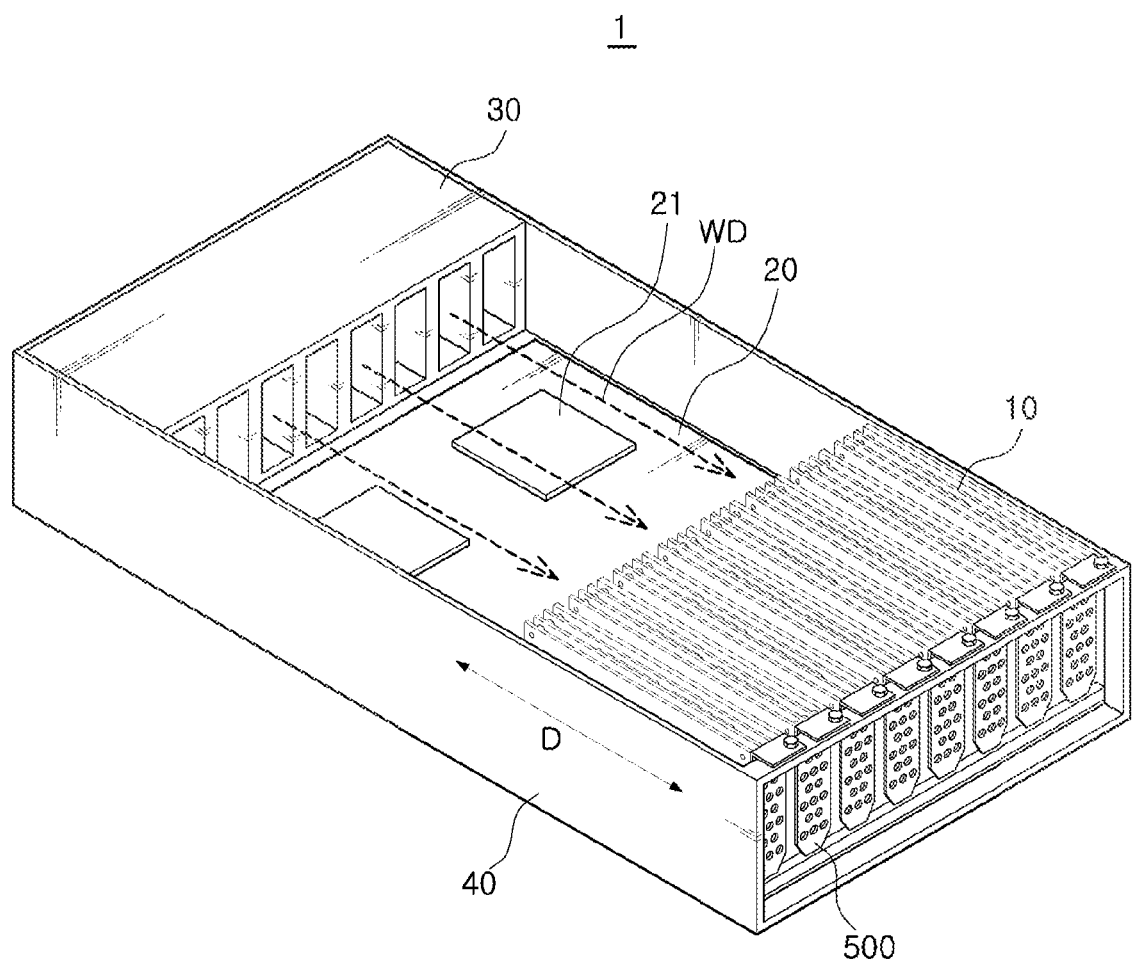
FIG. 11 is a broken away view of a computer server system employing a solid-state drive device according to the present inventive concept.

A computer server system employing a solid-state drive device, in accordance with the present inventive concept, will now be described in detail with reference to FIG. 11. For this purpose, the solid-state drive device 10 shown in and described with reference to FIGS. 1-5A will be used as an example but a similar computer server system may employ any solid-state drive according to the present inventive concept.

The computer server system 1 may include an enclosure 40, a cooling fan 30, a form factor card adapter and the solid-state drive device 10. A bay satisfying the above-mentioned form factor may be disposed at one end of an interior space of the enclosure 40. In an example, the bay may satisfy an add-in card (AIC) form factor, and the solid-state drive device 10 or a plurality of the solid-state devices 10 may be mounted in the AIC form factor bay. A main board 20 may be disposed in the enclosure 40. A central processing unit (CPU) 21 and several form factor card adapters may be disposed on the main board 20, and the solid-state drive device(s) 10 may be mounted on the form factor card adapters, respectively. The cooling fan 30 is disposed at the other end of the enclosure 40 such that air blown from the cooling fan 30 may force to flow in an air blowing direction WD from an end of the enclosure 40 to the end thereof provided with the bay containing the solid-state drive device(s) 10. The air blown by the cooling fan 30 may pass through the CPU 21 in the air blowing direction WD, to cool the solid-state drive device(s) 10. The longitudinal direction D of the heat dissipating member 300 of each solid-state drive device 10 coincides with the air blowing direction WD, such that air may flow easily in the longitudinal direction D through the air passageways 322 in the protruding portion 320 of the heat dissipating member 300 (see FIG. 4). Thus, the cooling efficiency of the solid-state drive device 10 may be enhanced.

As described in detail above, in a solid-state drive device and a computer server system including a solid-state drive device according to the present inventive concept, a plurality of modules of the solid-state drive device are each in direct thermal contact with a heat dissipating member. Accordingly, the heat dissipation efficiency of a solid-state drive device and a computer server according to the present inventive concept is relatively great.

Although examples of the present inventive concept have been shown and described above, it will be apparent to those skilled in the art that such examples may be modified or varied without departing from the true spirit and scope of the present inventive concept as defined by the appended claims.

What is claimed is:

1. A solid-state drive device comprising:
a first module including at least one volatile main memory device, a controller and at least one first nonvolatile memory device, the first module having a first region containing the at least one volatile main memory device and the controller and a second region containing the at least one first nonvolatile memory device;
a second module disposed on the first module, the second module overlapping the second region of the first module as viewed in a plan view of the solid-state drive device, the second module including at least one second nonvolatile memory device and having a third region containing the at least one second nonvolatile memory device; and
a heat dissipating member disposed on the second module such that the second module is interposed between the heat dissipating member and the first module, having a first surface disposed toward the first module and a second surface opposite the first surface, and elongated in one direction,
wherein the heat dissipating member has a plate-shaped portion and a protruding portion disposed at the first surface,
the protruding portion protrudes toward the first module relative to the plate-shaped portion and is in direct thermal contact with the first region of the first module,
the protruding portion has at least one first air passageway extending therethrough in the one direction above the at least one volatile main memory device and at least one second air passageway extending therethrough in the one direction above the controller, and
the plate-shaped portion is in direct thermal contact with the third region of the second module.

2. The solid-state drive device of claim 1, wherein each of the at least one second air passageway extends from each of the at least one first air passageway.

3. The solid-state drive device of claim 1, wherein a number of the at least one first air passageway is the same with a number of at least one second air passageway.

4. The solid-state drive device of claim 1, wherein a cross-sectional are the at least one first air passageway is substantially the same with a cross-sectional area of the at least one second air passageway.

5. The solid-state drive device of claim 1, wherein the at least one first air passageway and the at least one second air passageway are hollow tubes.

6. The solid-state drive device of claim 1, wherein the at least one first air passageway and the at least one second air passageway are grooves concavely formed in the first surface of the heat dissipation member.

7. The solid-state drive device of claim 1, wherein the at least one first air passageway and the at least one second air passageway are grooves concavely formed in the second surface of the heat dissipation member.

8. The solid-state drive device of claim 7, wherein the heat dissipating member further includes at least one groove disposed the plate-shaped portion and arranged in the one direction.

9. A solid-state drive device comprising:
a first module including at least one volatile main memory device, a controller and at least one first nonvolatile memory device, the first module having a first region containing the at least one volatile main memory device and the controller and a second region containing the at least one first nonvolatile memory device;
a second module disposed on the first module, the second module overlapping the second region of the first module as viewed in a plan view of the solid-state drive device, the second module including at least one second nonvolatile memory device, having a third region containing the at least one second nonvolatile memory device, and having a open region; and
a heat dissipating member disposed on the second module such that the second module is interposed between the heat dissipating member and the first module, having a first surface disposed toward the first module and a second surface opposite the first surface, and elongated in one direction,
wherein the heat dissipating member has a first protruding portion and a second protruding portion disposed at the first surface penetrating the open region of the second module,
the first protruding portion protrudes toward the first module and the second protruding portion protrudes toward the second module, and the first protruding portion is in direct thermal contact with the first region of the first module and the second protruding portion is in direct thermal contact with the third region of the second module,
the first protruding portion has at least one first air passageway extending therethrough in the one direction above the at least one volatile main memory device and at least one second air passageway extending therethrough in the one direction above the controller, and
the second protruding portion has at least one third air passageway extending therethrough in the one direction above the at least one second nonvolatile memory device.

10. The solid-state drive device of claim 9, wherein each of the at least one second air passageway extends from each of the at least one first air passageway, and each of the at least one third air passageway extends from each of the at least one first air passageway or each of the at least one second air passageway.

11. The solid-state drive device of claim 9, wherein a number of the at least one first air passageway is the same with a number of at least one second air passageway, and a number of the at least one third air passageway is less than or equal to the number of at least one second air passageway.

12. The solid-state drive device of claim 9, wherein the open region has a first part overlying the second region and a second part overlying the first region.

13. The solid-state drive device of claim 12, wherein the third region is divided into two parts by the second part.

14. The solid-state drive device of claim 12, wherein a width of the second protruding portion is smaller than a width of the first protruding portion.

15. The solid-state drive device of claim 12, wherein a width of the second protruding portion is substantially the same with a width of the first protruding portion.

16. The solid-state drive device of claim 9, wherein the second module has a rectangular shape.

17. The solid-state drive device of claim 16, wherein the third region is disposed parallel to the first protruding portion and the second protruding portion.

18. The solid-state drive device of claim 9, wherein the first region and the second region are arranged in the one direction.

19. The solid-state drive device of claim 9, wherein the second protruding portion extends from the first protruding portion in the one direction.

20. The solid-state drive device of claim 9, wherein the controller is disposed closer to the second region than the at least one volatile main memory device.

* * * * *